(12) United States Patent
Chen et al.

(10) Patent No.: US 8,391,089 B2
(45) Date of Patent: Mar. 5, 2013

(54) METHOD AND CIRCUIT OF CALIBRATING DATA STROBE SIGNAL IN MEMORY CONTROLLER

(75) Inventors: Yi Ling Chen, Hsinchu Hsien (TW); Yo Ling Chen, Hsinchu Hsien (TW)

(73) Assignee: MStar Semiconductor, Inc. (TW)

( * ) Notice: Subject to any disclaimer, the term of this patent is extended or adjusted under 35 U.S.C. 154(b) by 348 days.

(21) Appl. No.: 12/718,865

(22) Filed: Mar. 5, 2010

(65) Prior Publication Data

US 2010/0238747 A1    Sep. 23, 2010

(30) Foreign Application Priority Data

Mar. 18, 2009 (TW) .................. 98108835 A

(51) Int. Cl.
*G11C 7/00* (2006.01)

(52) U.S. Cl. ............... 365/193; 365/194; 365/233.1; 365/233.13

(58) Field of Classification Search .......... 365/193, 365/194, 233.1, 233.13

See application file for complete search history.

(56) References Cited

U.S. PATENT DOCUMENTS 7,385,861 B1 * 6/2008 Zhu .................. 365/194
2008/0123445 A1 * 5/2008 Vergnes et al. ............ 365/194
2009/0243679 A1 * 10/2009 Smith et al. .............. 327/158

FOREIGN PATENT DOCUMENTS

CN    101042925 A    9/2007

OTHER PUBLICATIONS

First Examination Opinion issued by State Intellectual Property Office of China on Apr. 25, 2011 regarding Chinese Patent Application No. 200910131160.9 (Document Serial No. 2011042000572440).

* cited by examiner

*Primary Examiner* — Toan Le
(74) *Attorney, Agent, or Firm* — Andy M. Han; Han IP Law PLLC

(57) ABSTRACT

A method for calibrating a data strobe (DQS) signal and associated circuit is provided. The calibrating method includes determining N buffers from a delay chain having M buffers to delay a predetermined phase during a first period; serially connecting the N buffers of the delay chain during a second period; and inputting the DQS signal to the N serially connected buffers to delay the DQS signal by the predetermined phase.

20 Claims, 12 Drawing Sheets

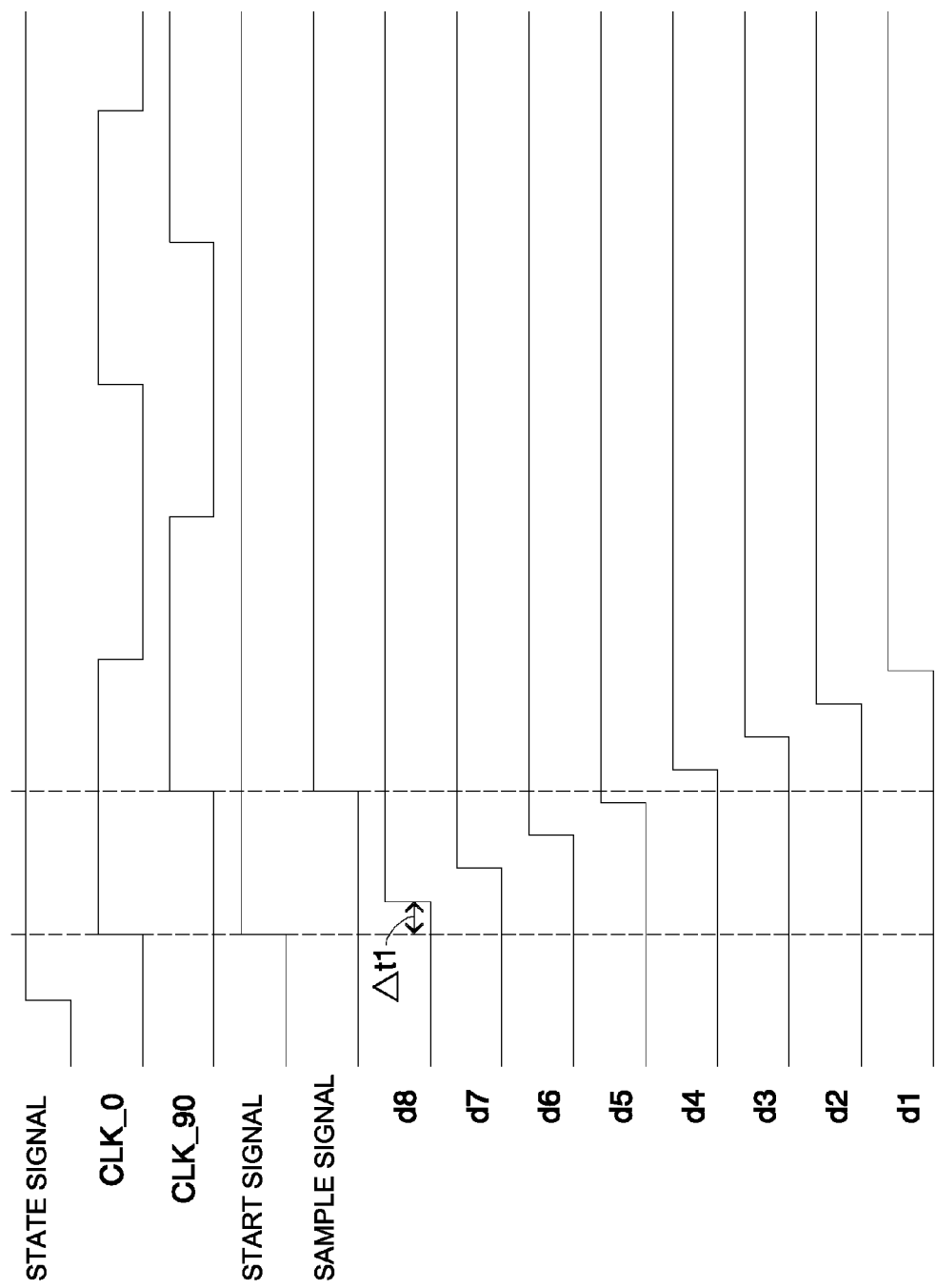

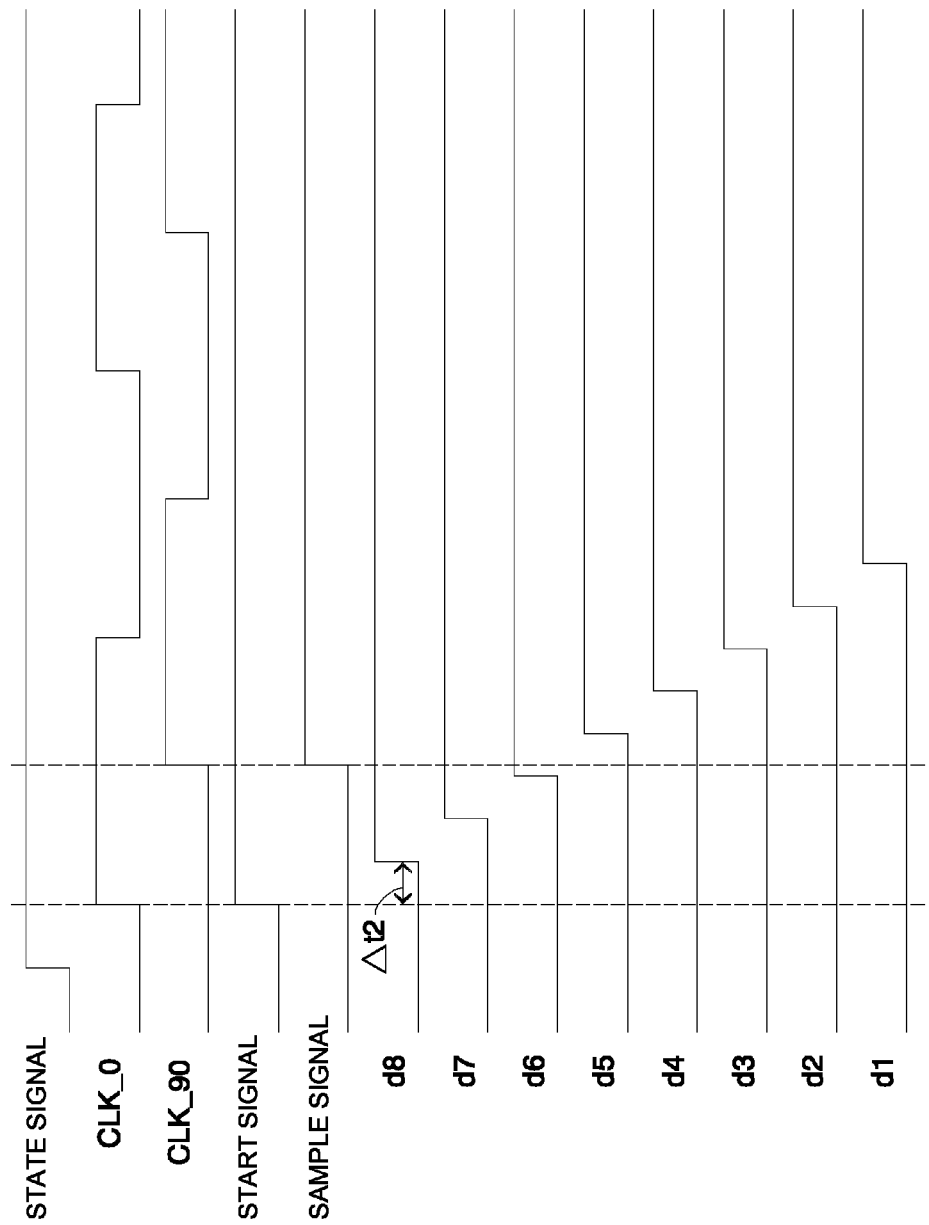

METHOD AND CIRCUIT OF CALIBRATING DATA STROBE SIGNAL IN MEMORY CONTROLLER

CROSS REFERENCE TO RELATED PATENT APPLICATION

This patent application claims priority from Taiwan patent application No. 098108835, filed in the Taiwan Patent office on Mar. 18, 2009, entitled "Method and Circuit of Calibrating Data Strobe Signal in Memory Controller", and incorporates the Taiwan patent application in its entirety by reference.

TECHNICAL FIELD

The present disclosure relates to a memory controller, and more particularly, to a circuit and a method for calibrating a data strobe signal in a memory controller.

BACKGROUND

Generally speaking, a memory controller accesses a memory module, e.g., a dynamic random access memory (DRAM) module. When the memory controller issues a write command, data is transmitted from the memory controller to a DRAM chip of the memory module and stored therein. When the memory controller issues a read command, data is transmitted from the DRAM chip of the memory module to the memory controller.

Taking a double data rate (DDR) memory module or a DDR dual in-line memory module (DDR DIMM) for example, a DDR transaction comprises steps below.

According to a command clock, the memory controller issues a command via command lines and address lines. In a next command clock, each of DDR memory modules accesses the command via the command lines and the address lines, and determines a DDR memory module associated with the command. After that, each of DRAM chips in the associated DDR memory module prepares to access data according to the command.

When the command is a read command, each of the DRAM chips begins to drive a data serial (DQ) signal and a data strobe (DQS) signal. When the command is a write command, the DQ signal and the DQS signal are driven by the memory controller. After that, the DQ signal and the DQS signal begin toggling. For example, when a memory module has eight DRAM chips, there are 64 DQ signals for transmitting data and 8 DQS signals for transmitting data clocks.

Refer to FIG. 1A and FIG. 1B showing signals of a DDR memory module. A memory controller 230 controls four DDR memory modules. For brevity, only two DDR memory modules 100 and 200 are illustrated in FIG. 1A and FIG. 1B. FIG. 1A shows signals outputted by the memory controller 230, including four command clock signals CMDCLK0 to CMDCLK3, four chip select signals CS0 to CS3, command signals, and address signals. The first DDR memory module 100 comprises eight DRAM chips 101 to 108, and a register 120. The second DDR memory module 200 comprises eight DRAM chips 201 to 208, and a register 220. The command signals and the address signals generated by the memory controller 230, e.g., address signals A0 to A13, a row address strobe (RAS) signal, a column address strobe (CAS) signal, a write enable (WE) signal, are transmitted to both the registers 120 and 220 of the DDR memory modules 100 and 200.

The memory controller 230 outputs four command clock signals CMDCLK0 to CMDCLK3 and four chip select signals CS0 to CS3 to either the register 120 of the DDR memory module 100 or the register 220 of the DDR memory module 200. According to the signals in FIG. 1A, addresses for reading data from or writing data to the DRAM chips 101 to 108 of the first DDR memory module 100 or the DRAM chips 201 to 208 of the second DDR memory module 200 are determined.

Refer to FIG. 1B showing DQ signals and DQS signals of DDR memory modules. The first DDR memory module 100 comprises eight DRAM chips 101 to 108, and the second DDR memory module 200 comprises eight DRAM chips 201 to 208. Each of the chips needs eight DQ signals in conjunction with one DQS signal, to provide eight byte lanes. Data transfer rate of each byte lane is controlled by one corresponding DQS signal.

Referring to FIG. 1B, the first DRAM chips 101 and 201 of the first memory module 100 and the second memory module 200 are coupled to the memory controller 300 through DQ signals DQ0 to DQ7 and a DQS signal DQS0. The second DRAM chips 102 and 202 of the first memory module 100 and the second memory module 200 are coupled to the memory controller 300 through DQ signals DQ8 to DQ15 and a DQS signal DQS1. The third DRAM chips 103 and 203 of the first memory module 100 and the second memory module 200 are coupled to the memory controller 300 through DQ signals DQ16 to DQ23 and a DQS signal DQS2. The fourth DRAM chips 104 and 204 of the first memory module 100 and the second memory module 200 are coupled to the memory controller 300 through DQ signals DQ24 to DQ31 and a DQS signal DQS3. The fifth DRAM chips 105 and 205 of the first memory module 100 and the second memory module 200 are coupled to the memory controller 300 through DQ signals DQ32 to DQ39 and a DQS signal DQS4. The sixth DRAM chips 106 and 206 of the first memory module 100 and the second memory module 200 are coupled to the memory controller 300 through DQ signals DQ40 to DQ47 and a DQS signal DQS5. The seventh DRAM chips 107 and 207 of the first memory module 100 and the second memory module 200 are coupled to the memory controller 300 through DQ signals DQ48 to DQ55 and a DQS signal DQS6. The eighth DRAM chips 108 and 208 of the first memory module 100 and the second memory module 200 are coupled to the memory controller 300 through DQ signals DQ56 to DQ63 and a DQS signal DQS7.

Accordingly, when the command is reading the first DDR memory module 100, eight DRAM chips 101 to 108 of the first DDR memory module 100 begin to drive the DQ signals DQ0 to DQ63 and the DQS signals DQS0 to DQS7. When the command is writing into the first DDR memory module 100, the DQ signals DQ0 to DQ63 and the DQS signals DQS0 to DQS7 are driven by the memory controller 230. After that, the DQ signals DQ0 to DQ63 and the DQS signals DQS0 to DQS7 begin toggling.

Refer to FIG. 2A showing a diagram of DQ signals and DQS signals when the command is a read command. According to the DDR specification, when a DDR module transmits data, the DQ signals and the DQS signals are aligned with each other. Taking the DQ signals DQ0 to DQ7 and the DQS signal DQS0 for example, data of the DQ signals DQ0 to DQ7 needs to be aligned with rising edges and falling edges of the DQS signal DQS0. That is, when the command is a read command, DDR chips output DQ signals and DQS signals, which are received by the memory controller 230. Generally, DDR chips generate DQS signals with reference to positive-phase and negative-phase clock signals (CLK and $\overline{\text{CLK}}$, not shown) provided by the memory controller 230.

Refer to FIG. 2B showing a diagram of the DQS signal DQS0, adjusted by the memory controller, and the DQ signals DQ0 to DQ7. Upon receiving the aligned DQS signal DQS0 and the DQ signals DQ0 to DQ7, the memory controller 230 delays a phase of the DQS signal DQS0 by 90 degrees, and latches data on the byte lanes (i.e., DQ0 to DQ7) via the DQS signal DQS0 delayed by 90 degrees (i.e., DQS0_90).

FIG. 3 shows a DQS signal calibrating circuit inside a memory controller according to the prior art. The DQS signal calibrating circuit is a master-slave delay locked loop (DLL) for delaying a DQS signal. The master-slave DLL comprises a master delay chain 300, a slave delay chain 320, and a phase detector 330. The slave delay chain 320 is a replica of the master delay chain 300, i.e., the slave delay 320 has same fabrication conditions as the master delay chain 300, and is arranged adjacently to the master delay chain 300 to match with each other. The master delay chain 300 comprises eight buffers 301 to 308 connected in series, and each of the buffers 301 to 308 is capable of generating an output signal. A positive-phase clock signal CLK generated by a memory controller enters the first buffer 301 of the master delay chain 300 and the phase detector 330, and an output signal of the eighth buffer 308 of the master delay chain 300 enters the phase detector 330. Therefore, the phase detector 330 compares the positive-phase clock signal CLK and the output signal of the eighth buffer 308 to generate a control voltage $V_{ctl}$ to control propagation delay of the buffers 301 to 308 of the master delay chain 300, such that a fixed phase difference exists among the eight output signals. Referring to FIG. 2B, the phase difference is 45 degrees. The output signal of the first buffer 301 is the positive-phase clock signal CLK delayed by 45 degrees. The output signal of the second buffer 302 is the positive-phase clock signal CLK delayed by 90 degrees. The output signal of the third buffer 303 is the positive-phase clock signal CLK delayed by 135 degrees. The output signal of the fourth buffer 304 is the positive-phase clock signal CLK delayed by 180 degrees. The output signal of the fifth buffer 305 is the positive-phase clock signal CLK delayed by 225 degrees. The output signal of the sixth buffer 306 is the positive-phase clock signal CLK delayed by 270 degrees. The output signal of the seventh buffer 307 is the positive-phase clock signal CLK delayed by 315 degrees. The output signal of the eighth buffer 308 is the positive-phase clock signal CLK delayed by 360 degrees, which is the same as the phase of the positive-phase clock signal CLK.

The slave delay chain 320 comprises eight buffers 321 to 328 connected in series. The controls ends of the buffers 321 to 328 receive the control voltage $V_w$, and each of the buffers 321 to 328 is capable of delaying a fixed phase difference. The first buffer 321 of the slave delay chain 320 receives DQS signal.

Therefore, the control voltage $V_{ctl}$ simultaneously controls the buffers 301 to 308 of the master delay chain 300 and the buffers 321 to 328 of the slave delay chain 320, such that propagation delay of the buffers 301 to 308 and 321 to 328 is the same. Accordingly, the output signal of the second buffer 322 of the slave delay chain 320 is the DQS signal delayed by 90 degrees (referred to as DQS_90).

A matching degree between the master delay chain 300 and its replica, i.e., the slave delay chain 320, is proportional to $1/\sqrt{W \cdot L}$, where W and L represent a channel width and a channel length of a transistor, respectively. As the fabrication technology develops, the channel width and channel length of the transistor may become smaller and smaller. Therefore, the matching degree between the master delay chain 300 and the slave delay chain 320 becomes worse as the fabrication technology develops, such that a phase difference between the output signal of the second buffer 322 of the slave delay chain 320 and the DQS signal cannot be exactly 90 degrees.

SUMMARY OF THE DISCLOSURE

One object of the present disclosure is to provide a circuit and a method thereof for calibrating DQS signals in a memory controller to accurately output the 90-degree delayed DQS signal by implementing only one delay chain.

According to the present disclosure, a method for calibrating a DQS signal comprises determining N buffers from a delay chain having M buffers to delay a predetermined phase during a first period, serially connecting the N buffers of the delay chain during a second period; and inputting a DQS signal into the N serially connected buffers to delay the DQS signal by a predetermined phase.

According to the present disclosure, a circuit for calibrating a DQS signal comprises a control circuit, for receiving a state signal and correspondingly converting a test pattern or a calibration value to a control value; a signal generator, for receiving a first clock signal and a second clock signal with a predetermined phase difference from the first clock signal, to generate a start signal and a sampling signal; a multiplexer, for alternatively outputting the strobe signal and the start signal according to the state signal; a delay chain, comprising M buffers, coupled to the control circuit and the multiplexer; a sampling circuit, coupled to the delay chain, for generating a sampled value in response to the sampling signal; and a converting circuit, for converting the sampled value to a calibration value to be stored in the control circuit.

Following description and figures are disclosed to have a better understanding of the advantages of the present disclosure.

BRIEF DESCRIPTION OF THE DRAWINGS

FIG. 5A and FIG. 5B show an equivalent circuit for calibrating DQS signals during a refresh period and associated signal diagram.

FIG. 7A and FIG. 7B show signal diagrams in an equivalent circuit for calibrating DQS signals during a refresh period when propagation delays of buffers vary.

DETAILED DESCRIPTION OF THE PREFERRED EMBODIMENT

Data storage in DRAM is volatile in that DRAM refreshes every 5 µs to 10 µs, and each refresh takes about 50 ns to 70 ns. In other words, DRAM accesses the data during an access period, and refreshes the data during a refresh period.

According to the present disclosure, a delay chain is calibrated during the refresh period of DRAM to receive a DQS signal DQS_0 to calibrate the number of buffers required for providing a phase delay of 90 degrees or substantially 90 degrees. During the access period, the delay chain is implemented to accurately output the 90-degree delayed DQS signal DQS_90.

Figure 1A:
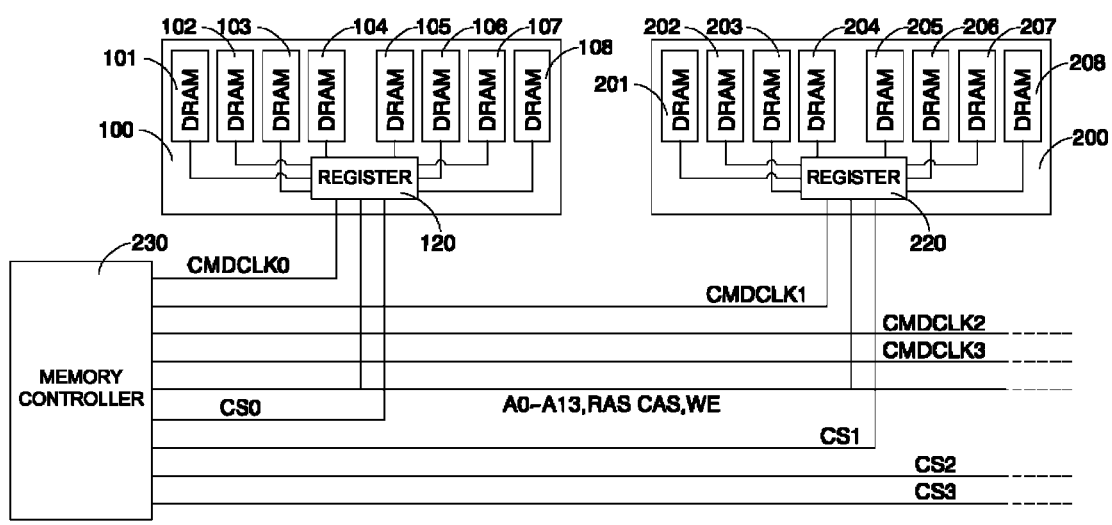
FIG. 1A and FIG. 1B shows a diagram of DDR memory modules.
Figure 1B:
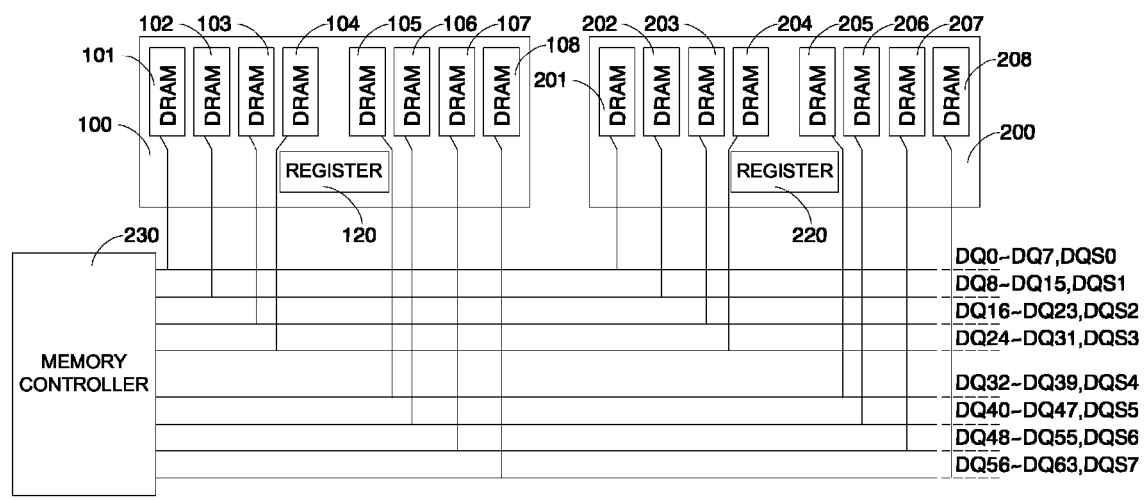
Figure 2A:
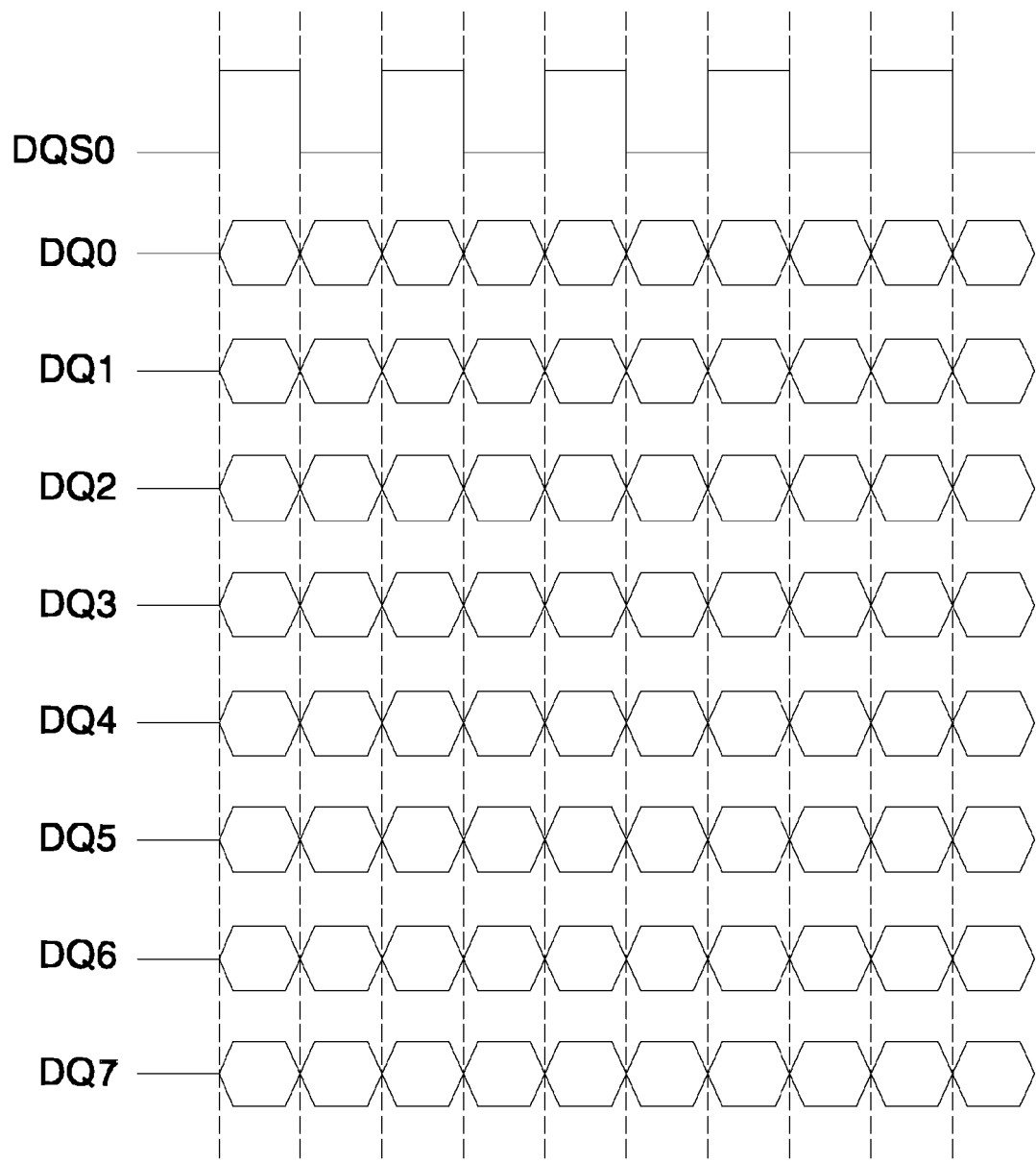
FIG. 2A shows a signal diagram of DQ signals and DQS signals of a DDR memory for a read command.
Figure 2B:
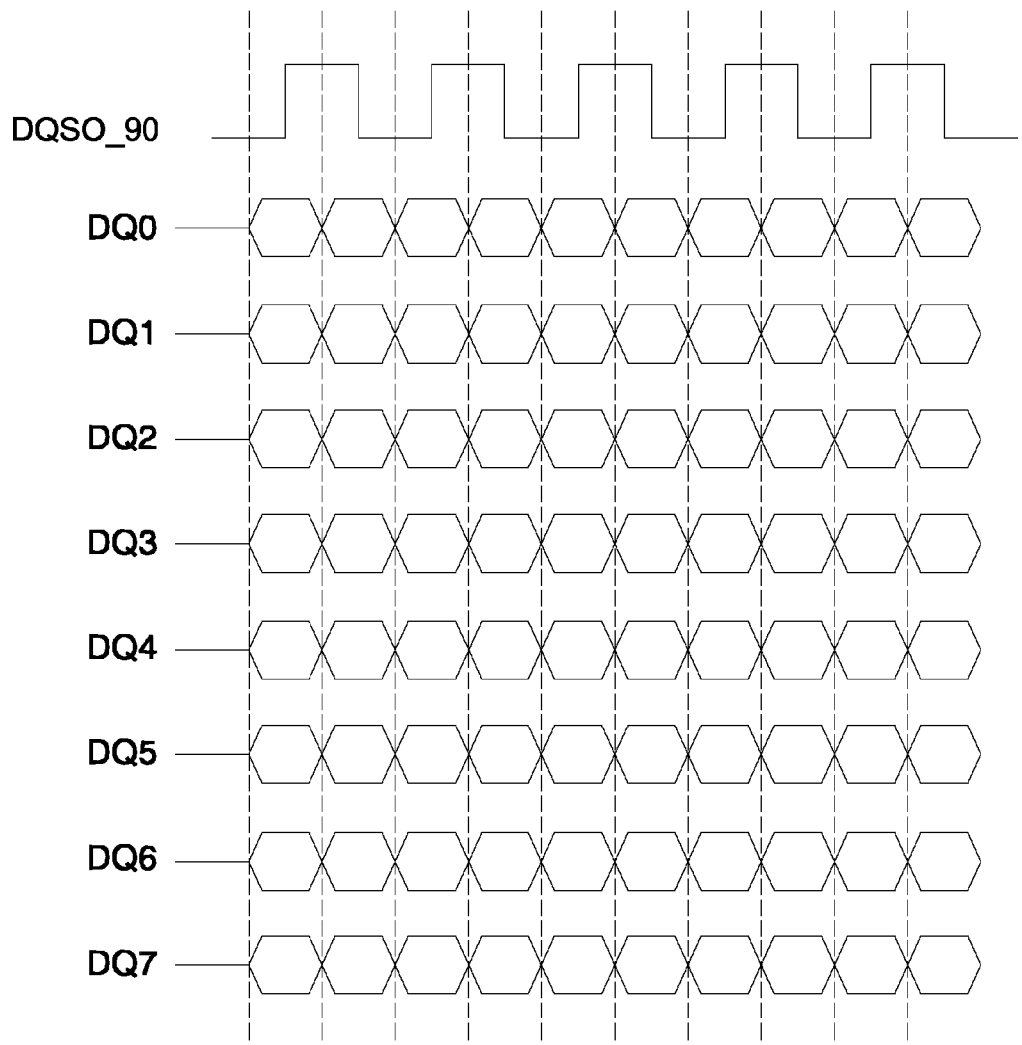
FIG. 2B shows a signal diagram of a DQS signal DQS0 and DQ signals DQ0 to DQ7 internally adjusted by the memory controller.
Figure 3:
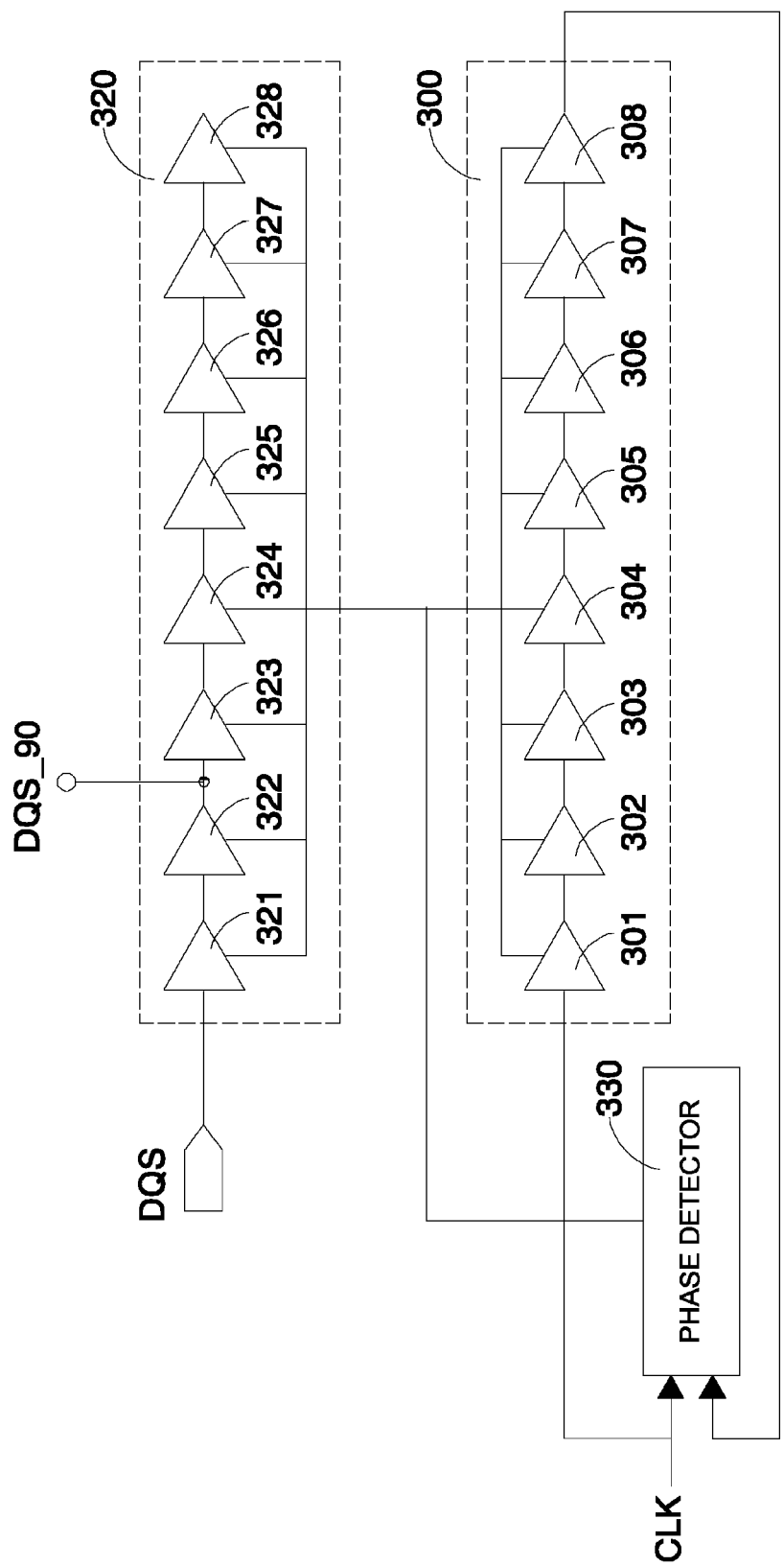
FIG. 3 shows a circuit for calibrating DQS signals in a memory controller in the prior art.
Figure 4:
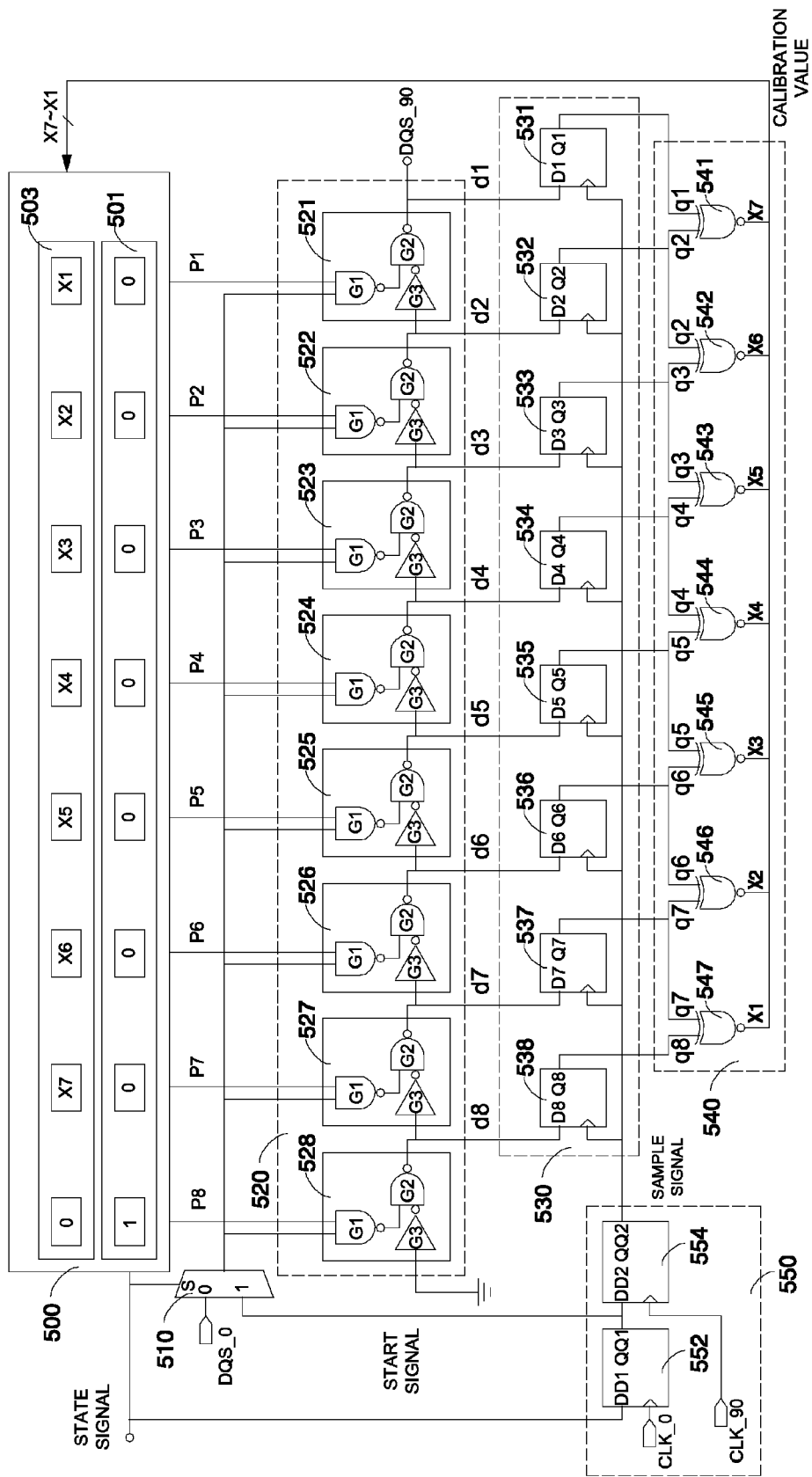
FIG. 4 shows a circuit for calibrating DQS signals in accordance with an embodiment of the present disclosure.

Refer to FIG. 4 showing a circuit for calibrating DQS signals in accordance with an embodiment of the present disclosure, implemented in a memory controller, is capable of receiving a DQS signal DQS_0 and accurately outputting a 90-degree delayed DQS signal DQS_90. The calibrating circuit comprises a control circuit 500, a multiplexer 510, a delay chain 520, a sampling circuit 530, a converting circuit 540, a signal generator 550.

A state signal indicates a state of DRAM. In this embodiment, when the DRAM is in an access period, the state signal is "0"; when the DRAM is in a refresh period, the state signal is "1". The control circuit 500 comprises a first storage unit 501 and a second storage unit 503. The first storage unit 501 stores a test pattern, e.g., [10000000], and the second storage unit 503 stores a calibration value, e.g., [0, x7, x6, x5, x4, x3, x2, x1]. In this embodiment, only one of the calibration values is "1" while others are "0". When the state signal is "0", the control value P8 to P1 outputted by the control circuit 500 is the calibration value; otherwise, when the state signal is "1", the control value P8 to P1 outputted by the control circuit 500 is test pattern.

The multiplexer 510 comprises a first input end (0), a second input end (1), a select end (S). The first input end (0) receives the DQS signal DQS_0, the second input end (1) receives a start signal, and the select end (S) receives the state signal. When the state signal is "0", the multiplexer 510 outputs the DQS signal DQS_0 at its output end. When the state signal is "1", the multiplexer 510 outputs the start signal at its output end.

The delay chain 520 comprises buffers 521 to 528 each having three input ends and one output end. Taking the first buffer 521 as an example, the first buffer 521 comprises a first NAND gate G1, a second NAND gate G2, and a NOT gate G3. The first NAND gate G1 has two inputs serving as a first input end and a second input end of the buffer 521. NOT gate G3 has an input end serving as a third input end of the buffer 521. An output end of the first NAND gate G1 and an output end of the NOT gate G3 are coupled to the second NAND gate G2. The second NAND gate G2 has an output end serving as an output end of the buffer 521.

In this embodiment, the first input end of each of the buffers 521 to 528 is coupled to the output end of the multiplexer 510, the second input end of each of the buffers 521 to 528 is coupled to a corresponding control value among P8 to P1, and the third input end of each of the buffers 521 to 527 is coupled to an output end of a next buffer while the third input end of the last buffer 528 is grounded. The output end of the first buffer 521 outputs the 90-degree delayed DQS signal DQS_90.

The sampling circuit 530 comprises a plurality of D flip-flops 531 to 538 each having a data input end (D8 to D1) coupled to an output end (d8 to d1) of a corresponding buffer among the buffers 521 to 528. Each of the D flip-flops 531 to 538 has a clock input end for receiving a sampling signal, and an output end (Q8 to Q1) for outputting a corresponding sampled value (q8 to q1).

The converting circuit 540 coverts the sampled values q8 to q1 to the calibration value x7 to x1 to be inputted into the second storage unit 503 of the control circuit 500. The converting circuit 540 comprises XOR gates 541 to 547. The first XOR gate 541 receives the sampled values q1 and q2 to output x7, the second XOR gate 542 receives the sampled values q2 and q3 to output x6, the third XOR gate 543 receives the sampled values q3 and q4 to output x5, the fourth XOR gate 544 receives the sampled values q4 and q5 to output x4, the fifth XOR gate 545 receives the sampled values q5 and q6 to output x3, the sixth XOR gate 546 receives the sampled values q6 and q7 to output x2, and the seventh XOR gate 547 receives the sampled values q7 and q8 to output x1.

The signal generator 550 comprises a first D flip-flop 552 and a second D flip-flop 554. The first D flip-flop 552 has a data input end DD1 for receiving a state signal, a clock input end for receiving a clock signal CLK_0, and a data output end QQ1 for outputting a start signal. The second D flip-flop 554 comprises a data input end DD2 coupled to the data output end QQ1 of the first flip-flop 552, a clock input end for receiving a clock signal CLK_90 by delaying the clock signal CLK_0 by 90 degrees, and a data output end QQ2 for outputting a sampled signal. Preferably, the clock signal CLK_0 and the DQS signal DQS_0 have substantially the same frequency, and the clock signal CLK_0 is provided to the DDR memory by the memory controller.

When a NAND gate receives an input signal of "a" and "1", the NAND gate outputting $\overline{a \cdot 1} = \overline{a}$ is equivalent to a NOT gate. When the NAND gate receives an input signal of "a" and "0", $\overline{a \cdot 0} = \overline{0} = 1$ is outputted. Operations of a circuit for calibrating DQS signals during a refresh period and an access period are described below.

Figure 5A:
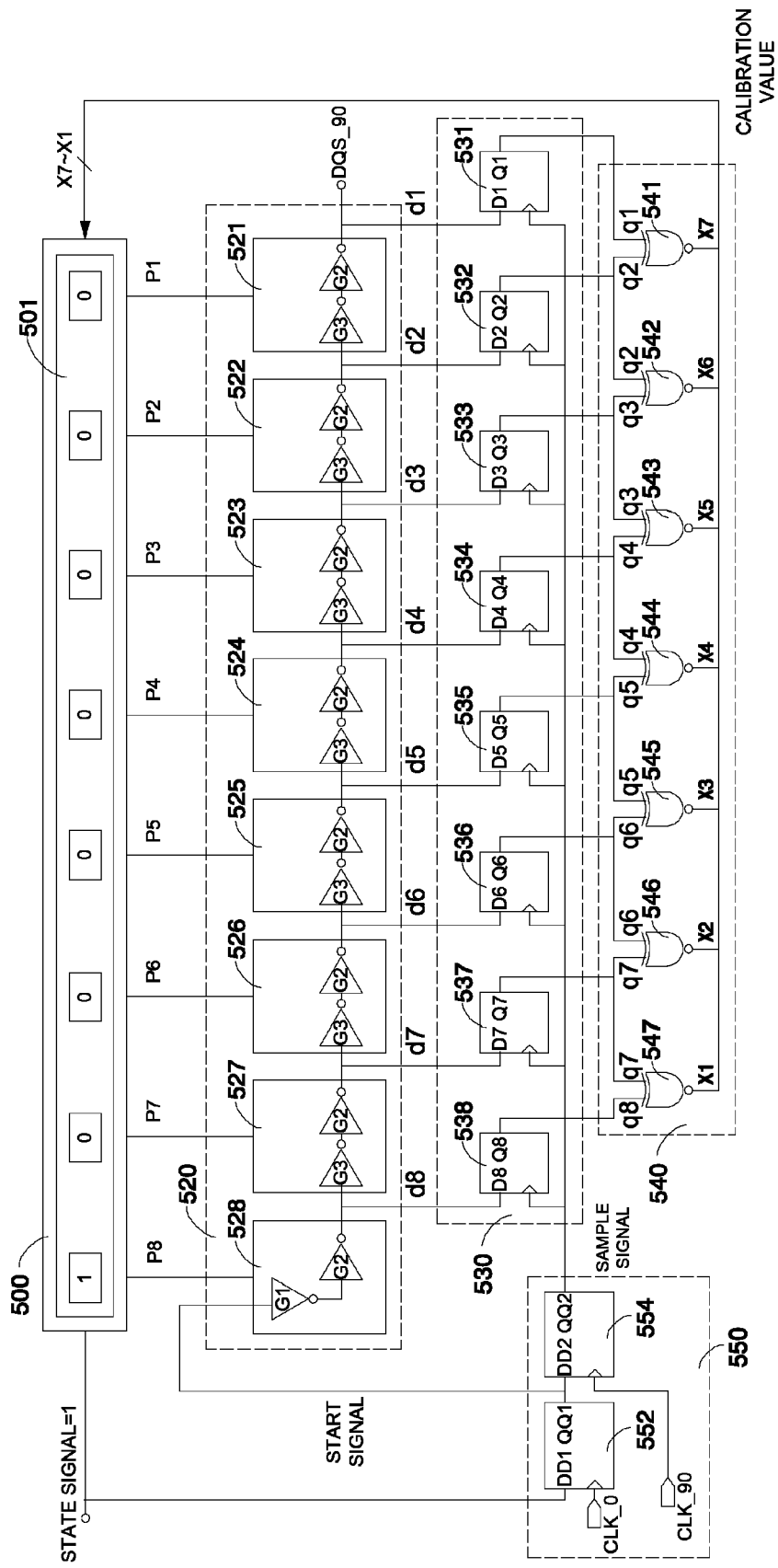

Refer to FIG. 5A showing an equivalent circuit of the circuit for calibrating the DQS signal during a refresh period. In this embodiment, during the refresh period, a state signal is "1", and the control circuit 500 issues a test pattern stored in the first storage unit 501 as the control value P8 to P1, e.g. [10000000]. Therefore, each of the buffers 521 to 528 of the delay chain 520 equivalently comprises an input end and an output end. The buffers 521 to 528 are serially connected and the eighth buffer 528 receives a start signal.

Refer to FIG. 5B showing a signal diagram of the equivalent circuit for calibrating the DQS signal during a refresh period. When a state signal is "1", at a rising edge of a clock signal CLK_0, a start signal transits from low level to high level. The start signal propagates in sequence from the eighth buffer 528 to the first buffer 521. Since the buffers 521 to 528 have a same propagation delay $^\Delta t1$ from one another, an interval $^\Delta t1$ exists between two successive rising edges of output signals d8 to d1 of the buffers 521 to 528.

In this embodiment, at a rising edge of a 90-degree delayed clock signal CLK_90, a sample signal transits from low level to high level. At this point, the D flip-flops 531 to 538 of the sampling circuit 530 sample the output signals d8 to d1 of the buffers 521 to 528 to generate sampled values q8 to q1, which are [11110000] as shown in FIG. 5B. Therefore, the converting circuit 540 converts the sampled values q8 to q1 to a calibration value x1 to x7 [0001000] to be stored in the second storage unit 503 of the control circuit 500. In this embodiment, the converting circuit 540 detects the transition of the sampled values, and stores the transition position into the second storage unit 503 of the control circuit 500. Therefore, during the access period, the calibration value in the second storage unit 503 of the control circuit 500 serves as the control value P8 to P1.

During the refresh period, the precise number of buffers for generating a phase delay of 90 degrees is obtained according to the sampled values q8 to q1 generated by the sampling circuit 530. In this embodiment, as shown in FIG. 5B, a delay time of four buffers (i.e. $4^\Delta t1$) results in the phase delay of 90 degrees of the clock signal CLK_0.

Figure 6:
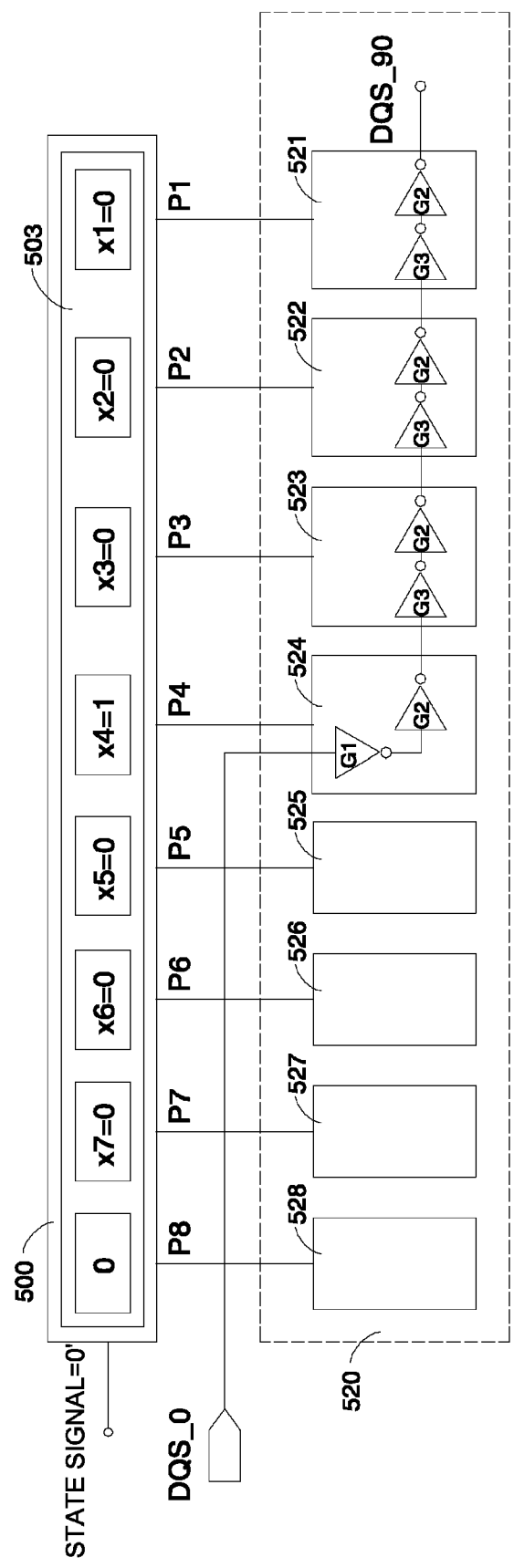
FIG. 6 shows an equivalent circuit of a calibrating DQS signals during an access period.

Refer to FIG. 6 showing an equivalent circuit of a circuit for calibrating DQS signals during an access period. In the access period, a state signal is "0", and the control circuit 500 applies the calibration value stored in the second storage unit 503 as the control value P8 to P1 [00001000]. Therefore, each of the buffers 521 to 528 of the delay chain 520 equivalently has an input end and an output end. Since P4 is "1", the fourth buffer 524 to the first buffer 521 are serially connected, and the eighth buffer 528 to the fifth buffer 525 cannot influence operations of the serially connected fourth buffer 524 to the first buffer 521. Therefore, the fourth buffer 524 receives a DQS signal DQS_0 at the input end, and the first buffer 521 outputs a 90-degree delayed DQS signal DQS_90 at the output end.

In this embodiment, a phase delay of 90 degrees by four buffers is detected during the refresh period. Therefore, during the access period, the four serially connected buffers 521 to 524 of the delay chain 520 are applied, such that 90-degree delayed DQS signal DQS_90 can be generated at the output end of the buffer 521.

It should be noted that, when the temperature of the circuit for calibrating the DQS signal changes, the propagation delays of the buffers 521 to 528 of the delay chain 520 also change accordingly. In the circuit provided by the present disclosure, the calibration value x7 to x1 can be modified to dynamically change the number of serially connected buffers of the delay chain 520, so as to accurately obtain the 90-degree delayed DQS signal DQS_90.

For example, when the propagation delay of the buffers changes from $^\Delta t1$ to $^\Delta t2$, the control circuit 500 may issue the test pattern stored in the first storage unit 501 as the control value P8 to P1 [10000000], during the refresh period. In this embodiment, each of the buffers 521 to 528 of the delay chain 520 equivalently has an input end and an output end. All buffers 521 to 528 are serially connected, and the eighth buffer 528 receives the start signal at the input end and propagates the start signal in sequence to the first buffer 521 according to the propagation delay $^\Delta t2$.

Refer to FIG. 7A showing a signal diagram in an equivalent circuit of a circuit for calibrating DQS signals during the refresh period when the propagation delay of buffers is increased. When the state signal is "1", at a rising edge of the clock signal CLK_0, the start signal transits from low level to high level. At this point, the start signal propagates in sequence from the eighth buffer 528 to the first buffer 521. Since all buffers 521 to 528 have a same propagation delay $^\Delta t2$ from one another, an interval $^\Delta t2$ exists between two successive rising edges of the output signals d8 to d1 of the buffers 521 to 528.

In this embodiment, at a rising edge of the 90-degree delayed clock signal CLK_90, the sample signal transits from low level to high level. At this point, the D flip-flops 531 to 538 of the sampling circuit 530 sample the output signal d8 to d1 of the buffers 521 to 528 to generate sampled values q8 to q1, which are [11100000] in this embodiment. It should be noted that the number of the sampled values with a value of "1" is decreased. The converting circuit 540 detects a transition position of the sampled values, such that the calibration value is x1 to x7 [0010000], i.e., the position of "1" is changed from x4 to x3. During the access period, the control value P8 to P1 are [00000100] to change the number of serially connected buffers to three. In this embodiment, an overall propagation time $(3*^\Delta t2)$ of the three buffers can result in the phase delay of 90 degrees.

For example, when the propagation delay of the buffers is reduced from $^\Delta t1$ to $^\Delta t3$, the control circuit 500 issues the test pattern stored in the first storage unit 501 as the control value P8 to P1 [10000000], during the refresh period. In this embodiment, each of the buffers 521 to 528 of the delay chain 520 equivalently has an input end and an output end, with all buffers 521 to 528 being serially connected. The eighth buffer 528 receives the start signal at the input end and propagates the start signal in sequence to the first buffer 521.

Figure 7B:
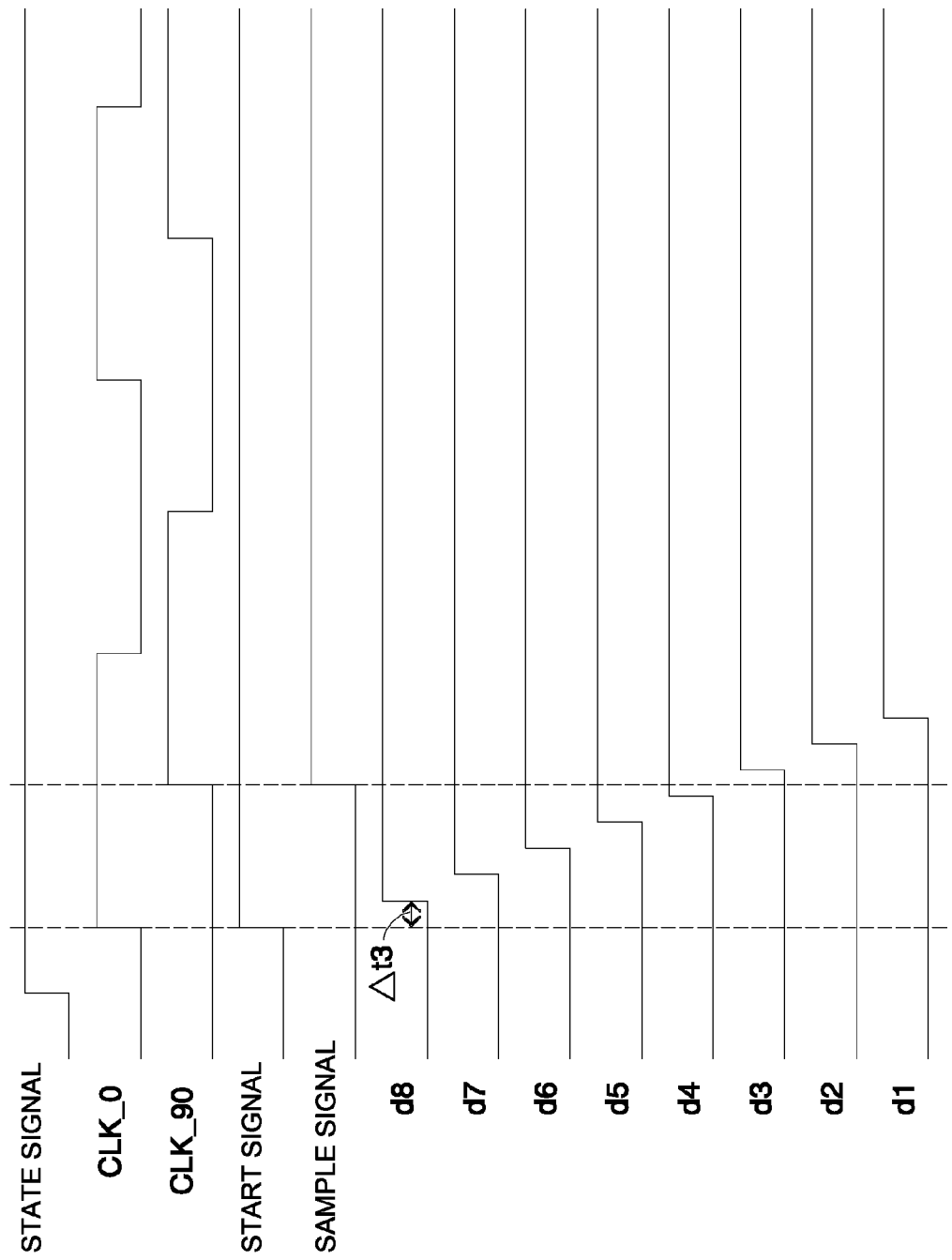

Refer to FIG. 7B showing a signal diagram in an equivalent circuit of a circuit for calibrating DQS signals during the refresh period when the propagation delay of buffers is reduced. When the state signal is "1", at a rising edge of the clock signal CLK_0, the start signal transits from low level to high level. At this point, the start signal propagates in sequence from the eighth buffer 528 to the first buffer 521. Since all buffers 521 to 528 have a same propagation delay $^\Delta t3$ from one another, an interval $^\Delta t3$ exists between two successive rising edges of the output signals d8 to d1 of the buffers 521 to 528.

In this embodiment, at a rising edge of the 90-degree delayed clock signal DQS_90, the sampled signal transits from low level to high level. At this point, the D flip-flops 531 to 538 of the sampling circuit 530 sample the output signal d8 to d1 of the buffers 521 to 528 to generate sampled values q8 to q1, which are [11111000] in this embodiment. It should be noted that the number of the samples values with a value of "1" increases. The converting circuit 540 detects transition position of the sampled values, such that the calibration value is represented by x1 to x7 [0000100], i.e., the position of "1" is changed from x4 to x5. During the access period, the control value P8 to P1 is applied as [00010000] to change the number of serially connected buffers to five. In this embodiment, an overall propagation time $(5*^\Delta t3)$ of the five buffers can result in the phase delay of 90 degrees.

In the foregoing embodiments, eight buffers are applied to form a delay chain as an example, and a person having ordinary skill in the art can implement various buffers to form the delay chain, such that a 90-degree delayed DQS signal is generated more accurately. A phase difference between the start signal generated by the signal generator 550 and the sample signal is 90 degrees, and a person having ordinary skill in the art can apply this approach to generate any precise predetermined phase difference.

Therefore, according to the present disclosure, with a method for calibrating DQS signals in a memory controller, N buffers are determined from a delay chain comprising M buffers to delay a predetermined phase. M and N are positive integers and N is less than or equal to M. During an access period, the N buffers of the delay chain are serially connected, and a DQS signal DQS_0 enters the N serially connected buffers to generate a DQS signal delayed by a predetermined phase by the N buffers.

Figure 8:
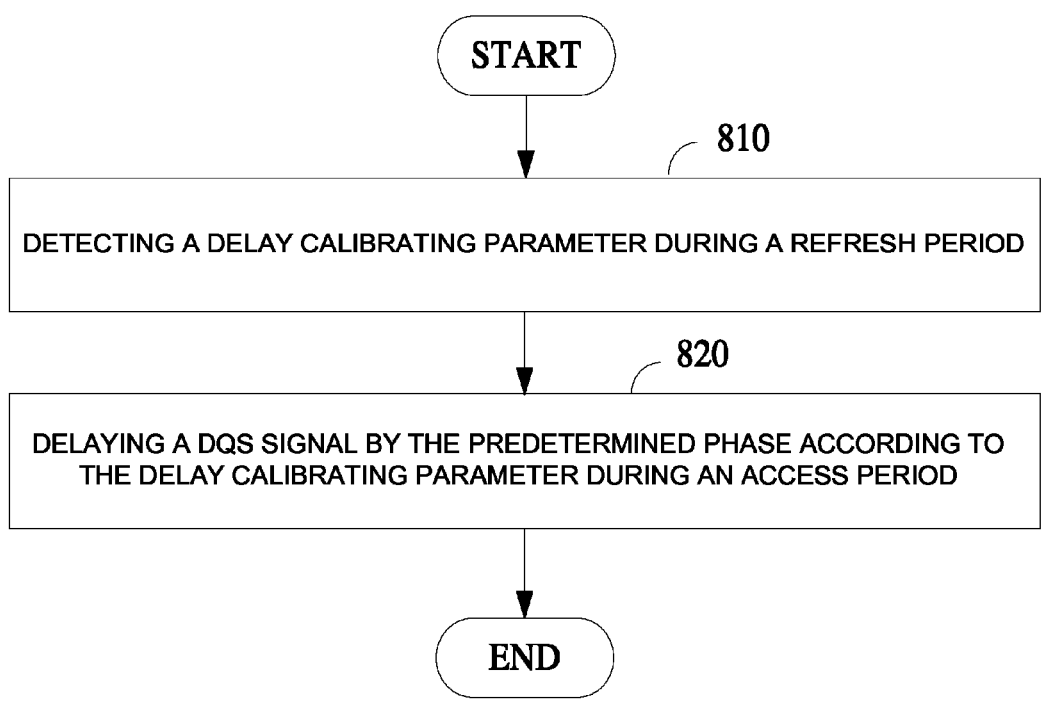
FIG. 8 is a flow chart of a method for calibrating DQS signals in accordance with an embodiment of the present disclosure.

Refer to FIG. 8 showing a flow chart of a method for calibrating a DQS signal in accordance with an embodiment of the present disclosure. In Step 810, during a first period, e.g., a refresh period, a delay calibrating parameter is detected. For example, the delay calibrating parameter is determined by detecting a number of buffers from a delay chain capable of providing a predetermined phase. For example, the delay calibrating parameter is determined by loading a test pattern during a refresh period to test the delay chain. In Step 820, during a second period, e.g., an access period, a DQS signal is delayed by the predetermined phase according to the delay calibrating parameter. For example, a plurality of buffers in the delay chain are serially connected according to the delay calibrating parameter, and the DQS signal enters the serially connected buffers to generate a delayed DQS signal with the predetermined phase delay.

To sum up, a circuit for calibrating DQS signals comprises a control circuit, a signal generator, a selector, a delay chain comprising M buffers, a sampling circuit and a converting circuit. The control circuit generates a control value in response to a state signal. The signal generator receives a clock signal and a clock signal delayed by a predetermined phase, so that a start signal and a sample signal are generated in response to the state signal. The selector receives a DQS signal, a start signal and a state signal, and generates a select output according to the state signal, e.g., the selector alternatively outputs the DQS signal or the start signal according to the state signal. The selector can be realized by a multiplexer or a switch component. The delay chain, coupled to the control circuit and the selector, receives the control value and the select output. The sampling circuit, coupled to the delay chain, generates sampled values in response to the sampling signal. The converting circuit converts the sampled values to the calibration value to be stored in the control circuit, e.g. the control circuit alternatively outputs the test pattern or the stored calibration value as the control value.

According to a method for calibrating a DQS signal provided by the present disclosure, during a first period, a delay calibrating parameter is detected, and during a second period, a DQS signal is delayed by a predetermined phase according to the delay calibrating parameter.

While the disclosure has been described in terms of what is presently considered to be the most practical and preferred embodiments, it is to be understood that the disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for calibrating a strobe signal in a memory controller, the method comprising:
   detecting a delay calibrating parameter during a first period; and
   delaying the strobe signal by a predetermined phase according to the delay calibrating parameter during a second period.

2. The method as claimed in claim 1, wherein the detecting step detects a plurality of buffers capable of delaying the strobe signal by the predetermined phase in a delay chain to determine the delay calibrating parameter during the first period.

3. The method as claimed for claim 2, wherein the delaying step serially connects the plurality of buffers according to the delay calibrating parameter, and inputs the strobe signal into the plurality of buffers to delay the strobe signal by the predetermined phase during the second period.

4. The method as claimed in claim 1, wherein the first period is a refresh period of a memory coupled to the memory controller.

5. The method as claimed in claim 1, wherein the second period is an access period of a memory coupled to the memory controller.

6. The method as claimed in claim 1, wherein the predetermined phase is substantially 90 degrees.

7. The method as claimed in claim 2, wherein the plurality of buffers are capable of delaying the strobe signal by the predetermined phase, and the strobe signal has a frequency that is substantially the same as a frequency of a clock signal.

8. The calibrating method as claimed in claim 1, wherein the detecting step detects the delay calibrating parameter by loading a test pattern to test a delay chain during the first period.

9. A method for calibrating a strobe signal in a memory controller, the method comprising:
   determining N buffers from a delay chain having M buffers during a first period in order to delay the strobe signal by a predetermined phase using the N buffers, M and N being positive integers and N being less than or equal to M;
   serially connecting the N buffers of the delay chain during a second period; and
   inputting the strobe signal to the N serially connected buffers to delay the strobe signal by the predetermined phase.

10. The method as claimed in claim 9, wherein the first period is a refresh period of a memory coupled to the memory controller, and wherein the second period is an access period of the memory.

11. A calibrating circuit for calibrating a strobe signal, the circuit comprising:
    a control circuit that generates a control value according to a state signal;
    a signal generator that receives a first clock signal and a second clock signal having a predetermined phase difference from the first clock to generate a start signal and a sampling signal in response to the state signal;
    a selector that alternatively outputs a strobe signal and the start signal according to the state signal as a select output;
    a delay chain comprising M buffers and coupled to the control circuit and the selector to receive the control value and the select output, M being a positive integer;
    a sampling circuit coupled to the delay chain to generate a sampled value in response to the sampling signal; and
    a converting circuit that converts the sampled value to a calibration value and provides the calibration value to the control circuit.

12. The calibrating circuit as claimed in claim 11, wherein the selector is a multiplexer or a switch.

13. The calibrating circuit as claimed in claim 11, wherein the calibration value is stored in the control circuit.

14. The calibrating circuit as claimed in claim 13, wherein the control circuit alternatively outputs a test pattern and the stored calibration value as the control value according to the state signal.

15. The calibrating circuit as claimed in claim 11, wherein the control circuit comprises:
    a first storage unit that stores a test pattern; and
    a second storage unit that stores the calibration value.

16. The calibrating circuit as claimed in claim 11, wherein the signal generator comprises:
    a first D flip-flop, the first D flip-flop comprising a data input end to receive the state signal, a clock input end to receive the first clock signal, and a data output end to output the start signal; and
    a second D flip-flop, the second D flip-flop comprising a data input end to receive the start signal, a clock input end to receive the second clock signal, and a data output end to output the sampling signal.

17. The calibrating circuit as claimed in claim 11, wherein in response to the state signal, the start signal is inputted into the M buffers that are serially connected and have output ends, and wherein the sampling circuit samples at the output ends of the M buffers to generate the sampled value.

18. The calibrating circuit as claimed in claim 17, wherein the state signal indicates a refresh period and an access period of a memory.

19. The calibrating circuit as claimed in claim 17, wherein in response to the state signal, N serially connected buffers of the M buffers, capable of delaying the predetermined phase difference, are determined from the delay chain according to the calibration value, N being a positive integer less than or equal to M, and wherein the strobe signal is inputted to the N serially connected buffers to generate a delayed strobe signal with the predetermined phase difference.

20. The calibrating circuit as claimed in claim 11, wherein a frequency of the clock signal is substantially the same as that of the strobe signal.

* * * * *